United States Patent
Kim et al.

(10) Patent No.: US 9,147,440 B2
(45) Date of Patent: Sep. 29, 2015

(54) SEMICONDUCTOR MEMORY DEVICE HAVING DUMMY BIT LINE

(71) Applicant: Samsung Electronics Co., Ltd., Suwon-si (KR)

(72) Inventors: Jin-Young Kim, Seoul (KR); Min-Gu Kang, Suwon-si (KR); Jae-Yun Lee, Anyang-si (KR); Beak-Hyung Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 133 days.

(21) Appl. No.: 13/945,418

(22) Filed: Jul. 18, 2013

(65) Prior Publication Data

US 2014/0022831 A1    Jan. 23, 2014

(30) Foreign Application Priority Data

Jul. 23, 2012   (KR) .......................... 10-2012-0079958

(51) Int. Cl.
| | |
|---|---|
| G11C 7/00 | (2006.01) |
| G11C 5/06 | (2006.01) |
| G11C 7/12 | (2006.01) |
| G11C 7/18 | (2006.01) |

(52) U.S. Cl.
CPC .. *G11C 5/06* (2013.01); *G11C 7/12* (2013.01); *G11C 7/18* (2013.01)

(58) Field of Classification Search
CPC ........................................................ G11C 7/00
USPC ........................................................ 365/210.1
See application file for complete search history.

(56) References Cited

U.S. PATENT DOCUMENTS

| | | | |
|---|---|---|---|
| 5,251,168 A * | 10/1993 | Chung et al. ..................... 365/51 |
| 2004/0042275 A1* | 3/2004 | Yoshizawa et al. ...... 365/189.07 |
| 2008/0112208 A1 | 5/2008 | Cho et al. |
| 2008/0205176 A1 | 8/2008 | Jetton et al. |
| 2010/0214861 A1 | 8/2010 | Shin et al. |
| 2010/0232198 A1* | 9/2010 | Maejima et al. ................. 365/51 |
| 2012/0008418 A1* | 1/2012 | Huh ........................ 365/185.25 |

FOREIGN PATENT DOCUMENTS

| | | |
|---|---|---|
| KR | 100827706 B1 | 4/2008 |
| KR | 1020100097424 A | 9/2010 |
| KR | 1020110001716 A | 1/2011 |

* cited by examiner

*Primary Examiner* — Min Huang
(74) *Attorney, Agent, or Firm* — Myers Bigel Sibley & Sajovec, P.A.

(57) ABSTRACT

A semiconductor memory device includes a plurality of functional bit lines, at least one dummy bit line, and a dummy bit line selection unit. The at least one dummy bit line is adjacent to an outermost bit line of the functional bit lines. The dummy bit line selection unit activates the at least one dummy bit line in response to a selection control signal of one of the plurality of functional bit lines that is not adjacent to the at least one dummy bit line. The semiconductor memory device may ensure a photo margin, so that the pattern size of the functional bit lines can be made uniform.

9 Claims, 4 Drawing Sheets

SEMICONDUCTOR MEMORY DEVICE HAVING DUMMY BIT LINE

CROSS-REFERENCE TO RELATED APPLICATION

This application claims priority under 35 USC §119 to Korean Patent Application No. 10-2012-0079958, filed on Jul. 23, 2012, in the Korean Intellectual Property Office (KIPO), the contents of which are herein incorporated by reference in their entirety.

BACKGROUND

1. Technical Field

The present disclosure relates generally to a semiconductor memory device, and more particularly to a semiconductor memory device having a dummy bit line aligned at an outer area of functional bit lines to provide a photo margin and to maintain pattern uniformity of an adjacent functional bit line.

2. Description of the Related Art

In a semiconductor memory device, a dummy bit line is formed at an outer portion of functional bit lines to ensure a photo margin and to maintain pattern uniformity of the functional bit lines aligned at an outer peripheral portion of a cell region.

The use of dummy bit lines has an advantage in terms of the manufacturing process. However, since the capacitive coupling may occur between a dummy bit line and an adjacent functional bit line, the dummy bit line may exert undesirable influence upon the read sensing operation of the functional bit lines when the adjacent functional bit line is in the floating state, that is, when the adjacent functional bit line is subject to other voltage having the VCC level or the GND level.

In addition, if the dummy bit line is maintained under the predetermined voltage state, the defect may not be detected by applying a test signal from an outside in the inspection stage of the semiconductor memory device. Thus, when a bridge is formed between the dummy bit line and the adjacent functional bit line, the sensing margin of the functional bit line may be weak.

SUMMARY

Some embodiments provide a semiconductor memory device capable of variably controlling voltage applied to a dummy bit line in the range of a ground voltage level to a power supply voltage level by using a control signal applied from an outside of a chip.

Some embodiments provide a semiconductor memory device capable of applying stress voltage to a dummy bit line in a test stage.

Some embodiments provide a semiconductor memory device capable of variably controlling voltage applied to a dummy bit line based on an operational state of a functional bit line without increasing a chip size.

According to some embodiments, a semiconductor memory device includes a plurality of functional bit lines, at least one dummy bit line, and a dummy bit line selection unit. The at least one dummy bit line is adjacent to an outermost bit line of the functional bit lines. The dummy bit line selection unit activates the at least one dummy bit line in response to a selection control signal of one functional bit line, which is not adjacent to the at least one dummy bit line, among the functional bit lines.

In some embodiments, the dummy bit line selection unit may comprise a dummy bit line select transistor switched in response to the selection control signal of the one functional bit line.

In some embodiments, the one functional bit line may comprise a functional bit line that is not adjacent to a functional bit line adjacent to the at least one dummy bit line.

In some embodiments, the semiconductor memory device may further comprise a cell block including a word line strapping region at a center area, wherein the cell block is divided into right and left regions about the word line strapping region. The functional bit lines may comprise first functional bit lines aligned at a predetermined space in the right region, and second functional bit lines aligned at a predetermined space in the left region. The number of the first functional bit lines may be even, and the number of the second functional bit lines may be even.

The semiconductor memory device may further comprise an odd functional bit line selection unit disposed above the cell block to select odd functional bit lines aligned in the right and left regions in response to a corresponding selection control signal, and an even functional bit line selection unit disposed under the cell block to select even functional bit lines aligned in the right and left regions in response to a corresponding selection control signal.

The at least one dummy bit line may comprise a first dummy bit line disposed on the right region between a leftmost functional bit line of the first functional bit lines and the word line strapping region, and a second dummy bit line disposed on the left region between a rightmost functional bit line of the second functional bit lines and the word line strapping region.

The dummy bit line selection unit may comprise an odd dummy bit line selection unit disposed above the cell block to select the first dummy bit line in response to a selection control signal of a rightmost odd functional bit line of the right region, and an even dummy bit line selection unit disposed under the cell block to select the second dummy bit line in response to a selection control signal of a leftmost even functional bit line of the left region.

In example embodiments, the semiconductor memory device may further comprise a cell block. The functional bit lines may be aligned on the cell block at a predetermined space. The at least one dummy bit line may comprise a first dummy bit line disposed between a left edge of the cell block and a leftmost functional bit line of the functional bit lines, and a second dummy bit line disposed between a right edge of the cell block and a rightmost functional bit line of the functional bit lines.

The semiconductor memory device may further comprise a plurality of odd functional bit line selection units disposed above the cell block to select odd functional bit lines in response to a corresponding selection control signal, and a plurality of even functional bit line selection units disposed under the cell block to select even functional bit lines in response to a corresponding selection control signal.

The dummy bit line selection unit may comprise a first dummy bit line selection unit adjacent to the odd functional bit line selection units, which are disposed above the cell block, to select the first dummy bit line by simultaneously interacting with the odd functional bit line selection unit disposed farthest from the first dummy bit line selection unit among the odd functional bit line selection units, and a second dummy bit line selection unit adjacent to the even functional bit line selection units, which are disposed under the cell block, to select the second dummy bit line by simultaneously interacting with the even functional bit line selection unit disposed farthest from the second dummy bit line selection unit among the even functional bit line selection units.

The first dummy bit line selection unit may be disposed to a left of a leftmost odd functional bit line selection unit of the odd functional bit line selection units to select the first dummy bit line by simultaneously interacting with a rightmost odd functional bit line selection unit of the odd functional bit line selection units. The second dummy bit line selection unit may be disposed to a right of a rightmost even functional bit line selection unit of the even functional bit line selection units to select the second dummy bit line by simultaneously interacting with a leftmost even functional bit line selection unit of the even functional bit line selection units.

According to some embodiments, a semiconductor memory device comprises a cell array region, a plurality of functional signal lines, at least one dummy line, a functional bit line selection unit, and a dummy bit line selection unit. The plurality of functional signal lines are aligned on the cell array region at a predetermined space. The at least one dummy line is disposed between an edge of the cell array region and an outermost functional signal line of the functional signal lines. The functional bit line selection unit is disposed in an adjacent region of the cell array region and includes a plurality of select transistors to select the functional signal lines in response to corresponding selection control signals, respectively. The dummy bit line selection unit is disposed adjacent to the functional selection unit and includes a dummy line select transistor to select the at least one dummy line in response to one selection control signal, which is configured to select a functional signal line disposed farthest from the at least one dummy line, among the selection control signals.

In some embodiments, the one selection control signal may be configured to select a functional signal line disposed farthest from a functional signal line adjacent to the at least one dummy line.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Various embodiments will be described more fully with reference to the accompanying drawings, in which some examples of embodiments of the inventive concepts are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of this disclosure and the relevant art and will not be interpreted in an idealized or overly formal sense unless expressly so defined herein.

Figure 1:
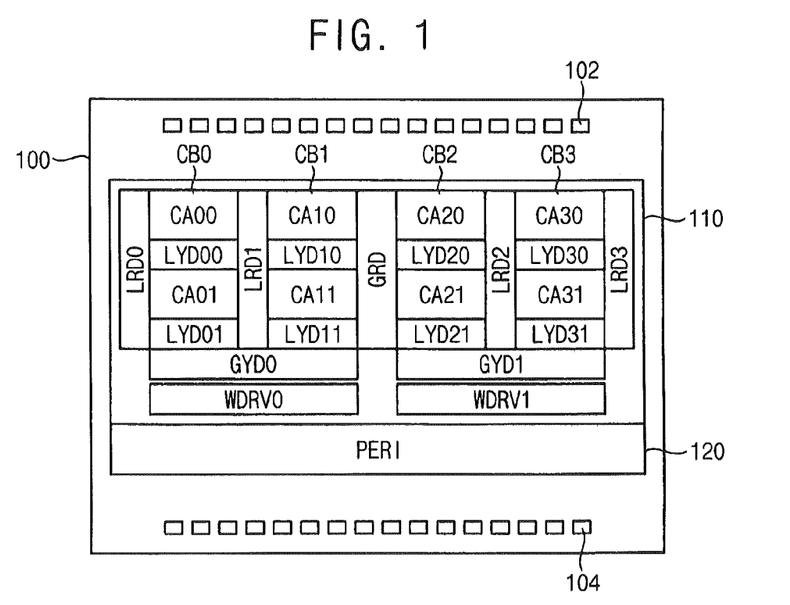
FIG. 1 is a view illustrating a chip layout of a semiconductor memory device according to an example embodiment.

FIG. 1 is a view illustrating a chip layout of a semiconductor memory device 100 according to some embodiments.

Referring to FIG. 1, the semiconductor memory device 100 include a plurality of first input/output pads 102 aligned in a first direction in the vicinity of an upper edge of the semiconductor memory device 100, and a plurality of second input/output pads 104 aligned in the first direction in the vicinity of a lower edge of the semiconductor memory device 100.

A cell region 110 and a peripheral region 120 are disposed in the longitudinal direction between the first and second input/output pads 102 and 104. The cell region 110 includes four banks CB0, CB1, CB2 and CB3 aligned in the horizontal direction. A global row decoder GRD is disposed between the cell banks CB1 and CB2, a first global column decoder GYD0 is disposed downward of the cell banks CB0 and CB1, and a second global column decoder GYD1 is disposed downward of the cell banks CB2 and CB3. A first write driver WDRV0 is disposed downward of the first global column decoder GYD0 and a second write driver WDRV1 is disposed downward of the second global column decoder GYD1.

Local row decoders LRD0 and LRD1 are disposed to the left of the cell banks CB0 and CB1, respectively, and local row decoders LRD2 and LRD3 are disposed to the right of the cell banks CB2 and CB3, respectively.

The cell bank CB0 includes cell array regions CA00 and CA01 aligned in the longitudinal direction. A local column decoder LYD00 is disposed downward of the cell array region CA00 and a local column decoder LYD01 is disposed downward of the cell array region CA01. The cell bank CB1 includes cell array regions CA10 and CA11 aligned in the longitudinal direction. A local column decoder LYD10 is disposed downward of the cell array region CA10 and a local column decoder LYD11 is disposed downward of the cell array region CA11. The cell bank CB2 includes cell array regions CA20 and CA21 aligned in the longitudinal direction. A local column decoder LYD20 is disposed downward of the cell array region CA20 and a local column decoder LYD21 is disposed downward of the cell array region CA21. The cell bank CB3 includes cell array regions CA30 and CA31 aligned in the longitudinal direction. A local column decoder LYD30 is disposed downward of the cell array region CA30 and a local column decoder LYD31 is disposed downward of the cell array region CA31.

Figure 2:
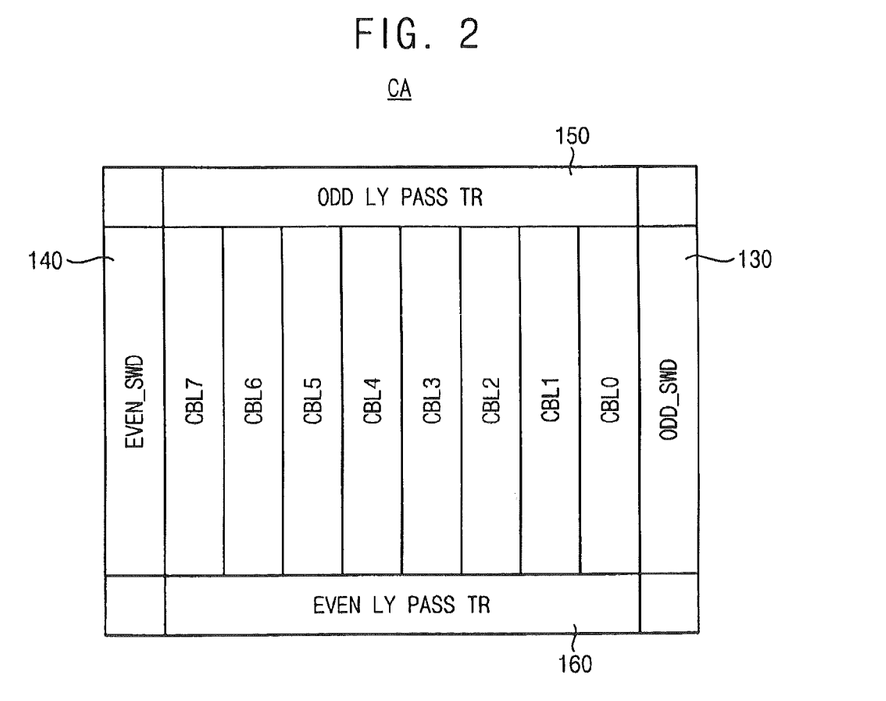
FIG. 2 is a view illustrating a detailed layout of a cell array region of FIG. 1.

FIG. 2 is a view illustrating a detailed layout of a cell array region CA of FIG. 1.

The cell array regions CA00, CA01, CA10, CA11, CA20, CA21, CA30 and CA31 can be implemented as the cell array region CA shown in FIG. 2.

Referring to FIG. 2, the cell array region CA includes eight cell blocks CBL0 to CBL7 aligned from the right to the left. An odd sub-word line driving region ODD_SWD 130 is disposed to the right of the cell block CLB0 and an even sub-word line driving region EVEN_SWD 140 is disposed to the left of the cell block CBL7. An odd column pass transistor region ODD LY PASS TR 150 is disposed upward of the eight cell blocks CBL0 to CBL7 and an even column pass transistor region EVEN LY PASS TR 160 is disposed downward of the eight cell blocks CBL0 to CBL7.

Figure 3:
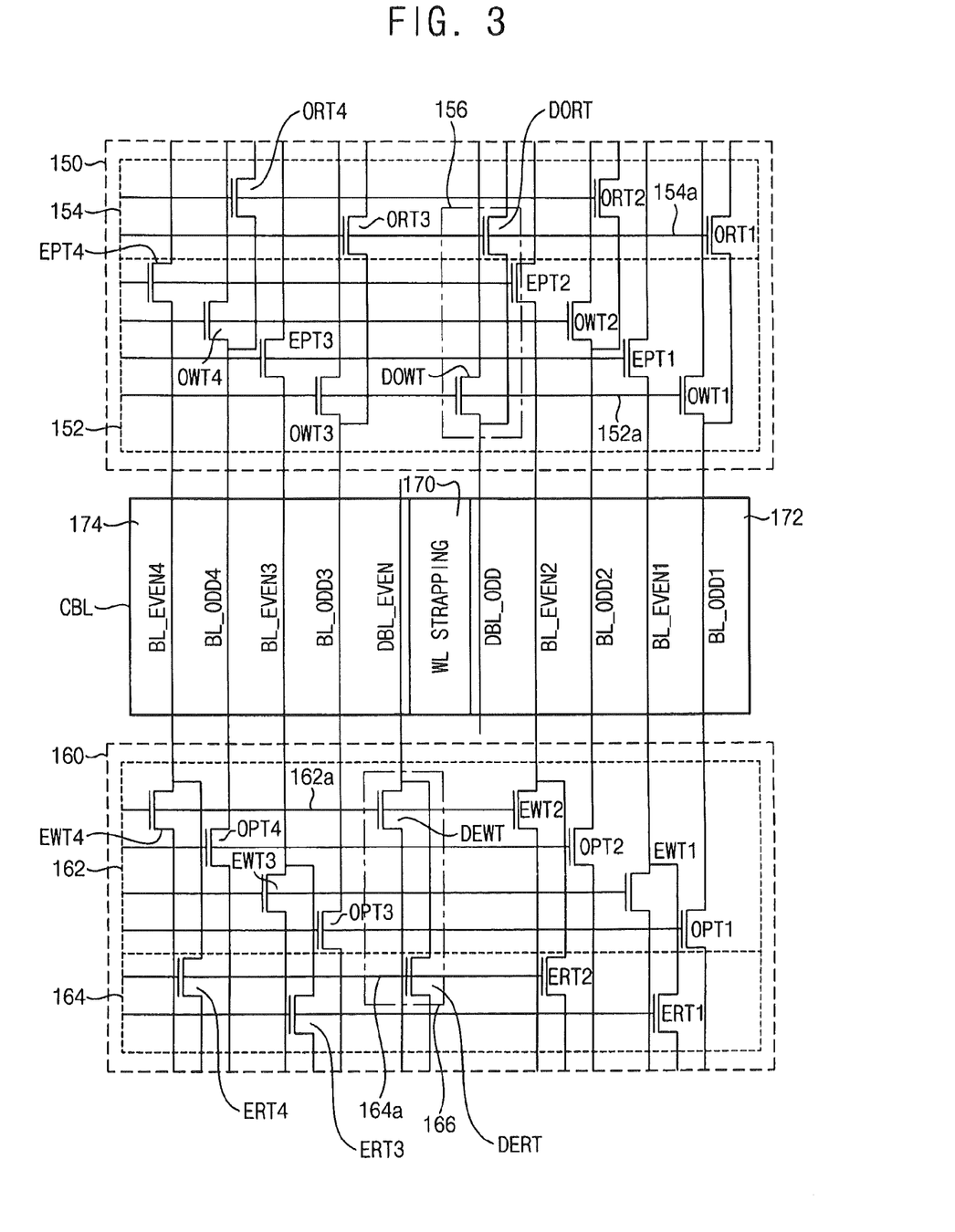
FIG. 3 is a view illustrating a column select structure of a functional bit line and a dummy bit line of a cell block of FIG. 2.

FIG. 3 is a view illustrating a column pass structure of a functional bit line and a dummy bit line of the cell block CBL of FIG. 2.

The cell block CBL of FIG. 3 may be one of the cell blocks CBL0, CBL1, CBL2, CBL3, CBL4, CBL5, CBL6 and CBL7 shown in FIG. 2.

Referring to FIG. 3, the cell block CBL is divided into right and left regions 172 and 174 about a word line strapping region 170. In the right region 172, an odd functional bit line BL_ODD1, an even functional bit line BL_EVEN1, an odd functional bit line BL_ODD2, and an even functional bit line BL_EVEN2 are sequentially aligned from a right edge to the center of the cell block CBL. In addition, an odd dummy bit line DBL_ODD is disposed between the even functional bit line BL_EVEN2 and the word line strapping region 170 in the right region 172 to ensure the photo margin, so that the pattern size of the functional bit lines can be made uniform.

In the left region 174, an odd functional bit line BL_ODD3, an even functional bit line BL_EVEN3, an odd functional bit line BL_ODD4, and an even functional bit line BL_EVEN4 are sequentially aligned from the center to the left edge of the cell block CBL. In addition, an even dummy bit line DBL_EVEN is disposed between the odd functional bit line BL_ODD3 and the word line strapping region 170 in the left region 174 to ensure the photo margin, so that the pattern size of the functional bit lines can be made uniform.

Pairs of write pass transistors and read pass transistors OWT1 and ORT1, OWT2 and ORT2, OWT3 and ORT3 and OWT4 and ORT4, which are connected in parallel to each other, are connected to upper ends of the odd functional bit lines BL_ODD1, BL_ODD2, BL_ODD3 and BL_ODD4, respectively. In addition, pass transistors OPT1, OPT2, OPT3 and OPT4 are connected to lower ends of the odd functional bit lines BL_ODD1, BL_ODD2, BL_ODD3 and BL_ODD4, respectively.

Pairs of write pass transistors and read pass transistors EWT1 and ERT1, EWT2 and ERT2, EWT3 and ERT3 and EWT4 and ERT4, which are connected in parallel to each other, are connected to lower ends of the even functional bit lines BL_EVEN1, BL_EVEN2, BL_EVEN3 and BL_EVEN4, respectively. In addition, pass transistors EPT1, EPT2, EPT3 and EPT4 are connected to upper ends of the even functional bit lines BL_EVEN1, BL_EVEN2, BL_EVEN3 and BL_EVEN4, respectively.

A selection unit 156 is connected to an upper end of the odd dummy bit line DBL_ODD. The selection unit 156 includes a pair of a write pass transistor DOWT and a read pass transistor DORT connected to an upper end of the odd dummy bit line DBL_ODD in parallel to each other.

Therefore, the write pass transistor DOWT configured to select the odd dummy bit line DBL_ODD is disposed in a space between the write pass transistors OWT2 and OWT3 in a write pass transistor region 152 of an odd pass transistor region 150. In addition, the read pass transistor DORT configured to select the odd dummy bit line DBL_ODD is disposed in a space between the read pass transistors ORT2 and ORT3 in a read pass transistor region 154 of the odd pass transistor region 150.

The write pass transistor DOWT is commonly connected to a control signal line 152a of the write pass transistor OWT1 of the odd functional bit line BL_ODD1 to commonly receive a selection control signal. In addition, the read pass transistor DORT is commonly connected to a control signal line 154a of the read pass transistor ORT1 of the odd functional bit line BL_ODD1 to commonly receive the selection control signal.

Thus, in order to allow the adjacent even functional bit line BL_EVEN2 to functionally operate without being influenced by the voltage applied to the odd dummy bit line DBL_ODD, the voltage level of the odd dummy bit line DBL_ODD is controlled to be the same as that of the odd functional bit line BL_ODD1 located farthest from the odd dummy bit line DBL_ODD.

A selection unit 166 is connected to a lower end of the even dummy bit line DBL_EVEN. The selection unit 166 includes a pair of a write pass transistor DEWT and a read pass transistor DERT connected to a lower end of the even dummy bit line DBL_EVEN in parallel to each other.

Therefore, the write pass transistor DEWT configured to select the even dummy bit line DBL_EVEN is disposed in a space between the write pass transistors EWT2 and EWT3 in a write pass transistor region 162 of an even pass transistor region 160. In addition, the read pass transistor DERT configured to select the even dummy bit line DBL_EVEN is disposed in a space between the read pass transistors ERT2 and ERT3 in a read pass transistor region 164 of the even pass transistor region 160.

The write pass transistor DEWT is commonly connected to a control signal line 162a of the write pass transistor EWT4 of the even functional bit line BL_EVEN4 to commonly receive a selection control signal. In addition, the read pass transistor DERT is commonly connected to a control signal line 164a of the read pass transistor ERT4 of the even functional bit line BL_EVEN4 to commonly receive the selection control signal.

Thus, in order to allow the adjacent odd functional bit line BL_ODD3 to functionally operate without being influenced by the voltage applied to the even dummy bit line DBL_EVEN, the voltage level of the even dummy bit line DBL_EVEN is controlled to be the same as that of the even functional bit line BL_EVEN4 located farthest from the even dummy bit line DBL_EVEN.

In detail, in the case that the pass transistors DEWT and DERT of the even dummy bit line DBL_EVEN are controlled by using the control signal line used to control the pass transistors EWT3 and ERT3 of the even functional bit line BL_EVEN3 relatively closed to the even dummy bit line DBL_EVEN, the discharged even dummy bit line DBL_EVEN may exert an influence upon the odd functional bit line BL_ODD3, which is in the floating state, through capacitive parasitic coupling. Thus, in order to prevent the influence exerted upon the adjacent functional bit line, the read operation margin of the even functional bit line BL_EVEN3 is very restricted or limited.

Therefore, according to example embodiments, the selection unit 166 of the even dummy bit line DBL_EVEN, that is, the pass transistors DEWT and DERT are controlled by using the control signal of the pass transistors EWT4 and ERT4 of the even functional bit line BL_EVEN4 located farthest from the pass transistors DEWT and DERT.

In addition, when a functional bit line stress test is performed, a high voltage is applied to the odd functional bit lines and a low voltage is applied to the even functional bit lines. Therefore, the voltage applied to the even dummy bit line DBL_EVEN, which is disposed in the left region 174, under the stress condition is the same as that of the even functional bit line, and the voltage applied to the odd dummy bit line DBL_ODD, which is disposed in the right region 172, under the stress condition is the same as that of the odd functional bit line, so the stress test condition may be satisfied.

Figure 4:
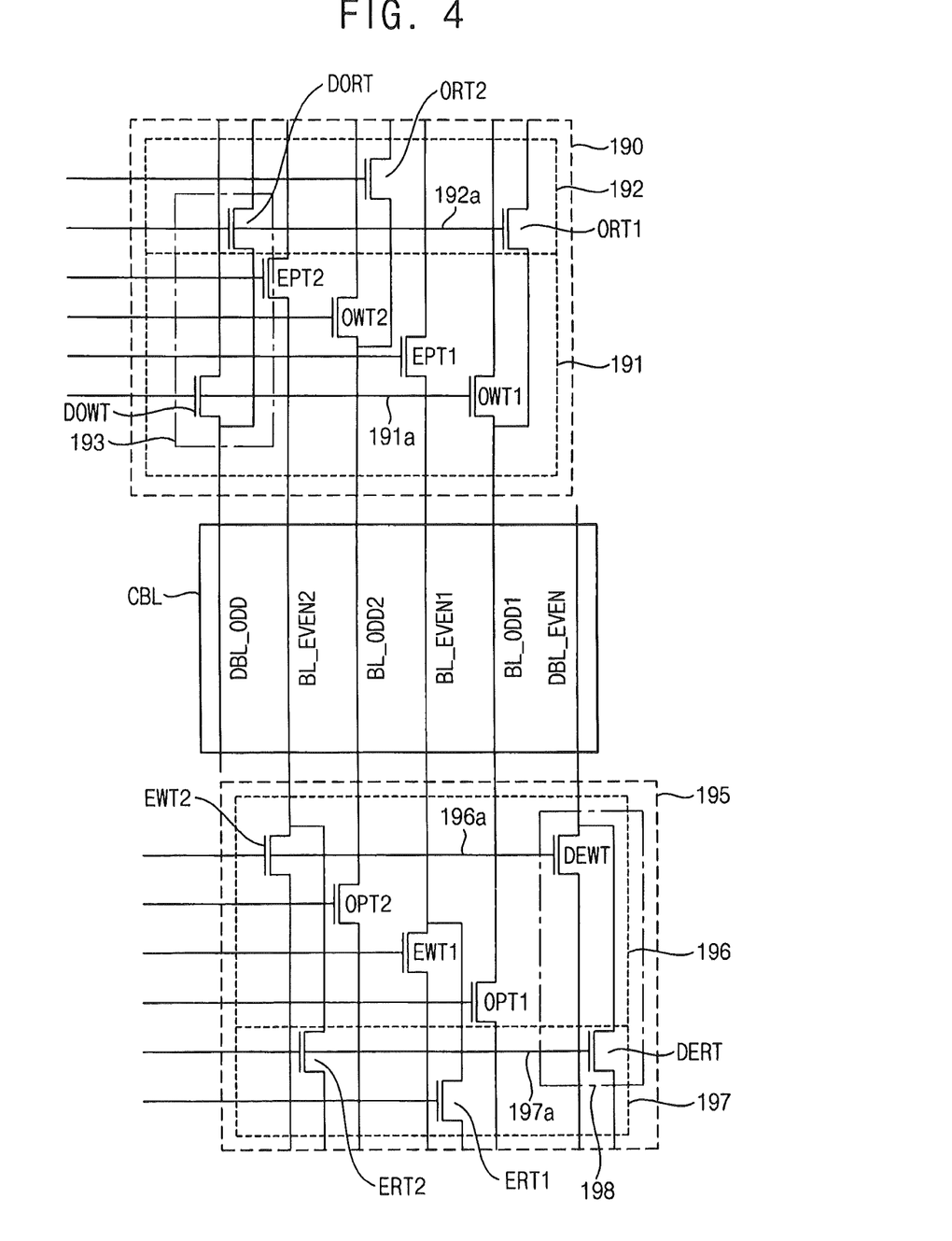
FIG. 4 is a view illustrating a modified example of a column pass structure of a functional bit line and a dummy bit line of a cell block.

FIG. 4 is a view illustrating a modified example of a column pass structure of the functional bit line and the dummy bit line of the cell block CBL.

The cell block CBL of FIG. 4 may be one of cell blocks CBL0, CBL1, CBL2, CBL3, CBL4, CBL5, CBL6 and CBL7 shown in FIG. 2.

Referring to FIG. 4, the modified example is similar to the example embodiment of FIG. 3 except that the dummy bit lines DBL_ODD and DBL_EVEN are disposed to the left and right of the cell block CBL. The same reference numerals will be assigned to the same elements.

Referring to FIG. 4, the odd functional bit line BL_ODD1, the even functional bit line BL_EVEN1, the odd functional bit line BL_ODD2, and the even functional bit line BL_EVEN2 are sequentially aligned from the right edge to the left edge of the cell block CBL. In addition, the even dummy bit line DBL_EVEN is disposed between the right edge and the odd functional bit line BL_ODD1. The odd functional bit line BL_ODD is disposed between the left edge and the even functional bit line BL_EVEN2.

Pairs of write pass transistors and read pass transistors OWT1 and ORT1 and OWT2 and ORT2, which are connected in parallel to each other, are connected to upper ends of the odd functional bit lines BL_ODD1 and BL_ODD2, respectively. In addition, pass transistors OPT1 and OPT2 are connected to lower ends of the odd functional bit lines BL_ODD1 and BL_ODD2, respectively.

Pairs of write pass transistors and read pass transistors EWT1 and ERT1 and EWT2 and ERT2, which are connected in parallel to each other, are connected to lower ends of the even functional bit lines BL_EVEN1 and BL_EVEN2, respectively. In addition, pass transistors EPT1 and EPT2 are connected to upper ends of the even functional bit lines BL_EVEN1 and BL_EVEN2, respectively.

A selection unit 193 is connected to an upper end of the odd dummy bit line DBL_ODD. The selection unit 193 includes a pair of a write pass transistor DOWT and a read pass transistor DORT connected to an upper end of the odd dummy bit line DBL_ODD in parallel to each other.

Therefore, the write pass transistor DOWT configured to select the odd dummy bit line DBL_ODD is disposed in a space adjacent to the write pass transistor OWT2 in a write pass transistor region 191 of an odd pass transistor region 190. In addition, the read pass transistor DORT configured to select the odd dummy bit line DBL_ODD is disposed in a space adjacent to the read pass transistor ORT2 in a read pass transistor region 192 of the odd pass transistor region 190.

The write pass transistor DOWT is commonly connected to a control signal line 191a of the write pass transistor OWT1 of the odd functional bit line BL_ODD1 to commonly receive a selection control signal. In addition, the read pass transistor DORT is commonly connected to a control signal line 192a of the read pass transistor ORT1 of the odd functional bit line BL_ODD1 to commonly receive the selection control signal.

Thus, in order to allow the adjacent even functional bit line BL_EVEN2 to operate functionally without being influenced by the voltage applied to the odd dummy bit line DBL_ODD, the voltage level of the odd dummy bit line DBL_ODD is controlled to be the same as that of the odd functional bit line BL_ODD1 located farthest from the odd dummy bit line DBL_ODD.

A selection unit 198 is connected to a lower end of the even dummy bit line DBL_EVEN. The selection unit 198 includes a pair of a write pass transistor DEWT and a read pass transistor DERT connected to a lower end of the even dummy bit line DBL_EVEN in parallel to each other.

The write pass transistor DEWT configured to select the even dummy bit line DBL_EVEN is disposed in a space adjacent to the write pass transistor EWT1 in a write pass transistor region 196 of an even pass transistor region 190. In addition, the read pass transistor DERT configured to select the even dummy bit line DBL_EVEN is disposed in a space adjacent to the read pass transistor ERT1 in a read pass transistor region 197 of the even pass transistor region 190.

The write pass transistor DEWT is commonly connected to a control signal line 196a of the write pass transistor EWT2 of the even functional bit line BL_EVEN2 to commonly receive a selection control signal. In addition, the read pass transistor DERT is commonly connected to a control signal line 197a of the read pass transistor ERT2 of the even functional bit line BL_EVEN2 to commonly receive the selection control signal.

Thus, in order to allow the adjacent odd functional bit line BL_ODD1 to functionally operate without being influenced by the voltage applied to the even dummy bit line DBL_EVEN, the voltage level of the even dummy bit line DBL_EVEN is controlled to be the same as that of the even functional bit line BL_EVEN2 located farthest from the even dummy bit line DBL_EVEN.

Figure 5:
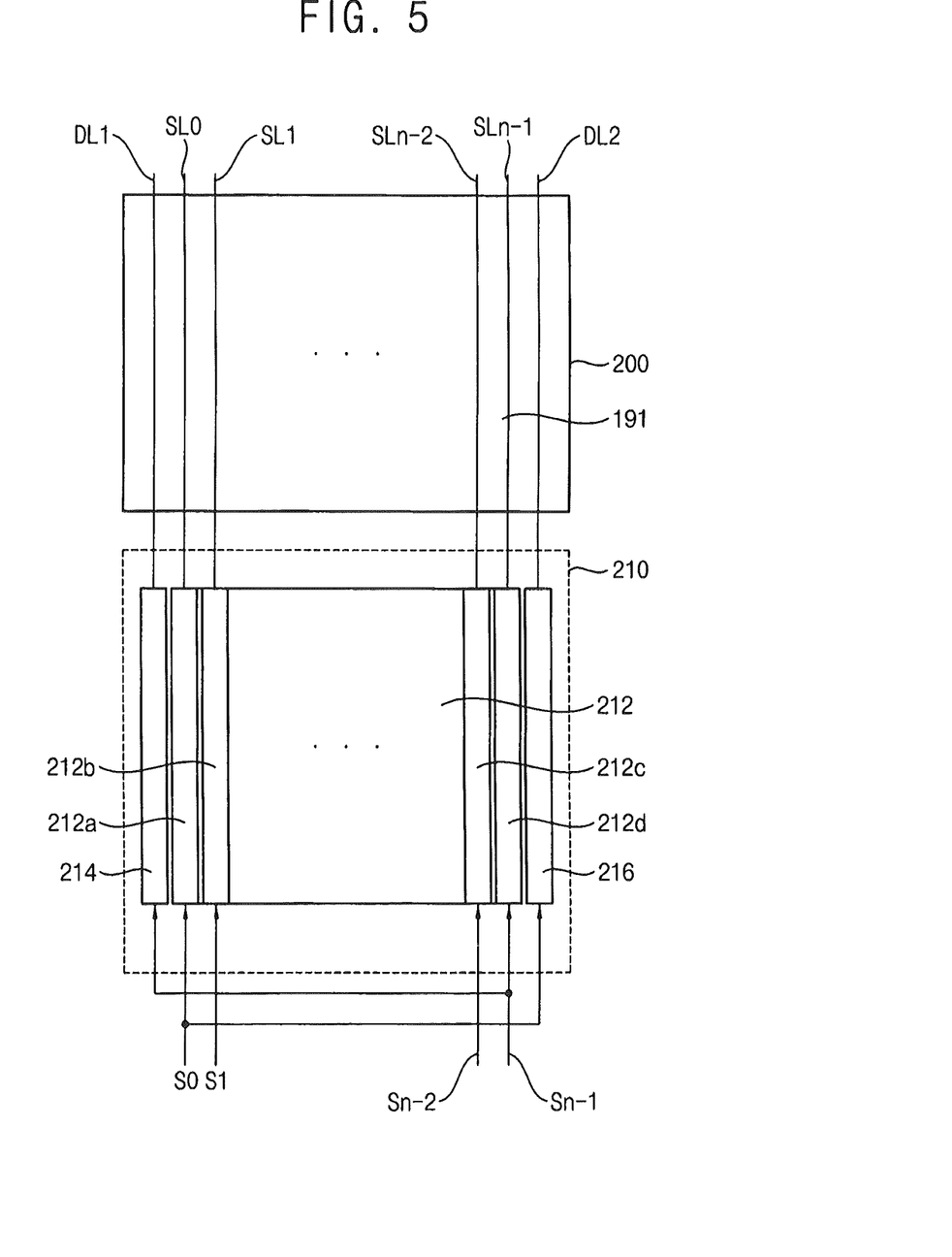
FIG. 5 is a view illustrating a semiconductor memory device having a dummy line according to a modified example embodiment.

FIG. 5 is a view illustrating a semiconductor memory device having a dummy line according to further embodiments.

Referring to FIG. 5, the semiconductor memory device includes a cell array region 200 and an adjacent region 210. A plurality of typical memory cells are formed in the cell array region 200. A plurality of functional signal lines SL0 to SLn−1 are aligned in the cell array region 200 at a regular interval to select the cells.

Dummy lines DL1 and DL2 are aligned on an edge of the cell array region 200 in adjacent to the outermost signal lines SL0 and SLn−1 of the functional signal lines SL0, SL1, - - -, SLn−2 and SLn−1. The functional signal lines SL0, SL1, - - -, SLn−2 and SLn−1 may include signal lines uniformly aligned at a regular interval, such as word lines or bit lines.

A functional selection unit 212 and dummy selection units 214 and 216 are formed in the adjacent region 210. The functional selection unit 212 include a plurality of select transistors 212a, 212b, 212c and 212d corresponding to the functional signal lines SL0, SL1, - - -, SLn−2 and SLn−1, respectively. The select transistors 212a, 212b, 212c and 212d are connected to the functional signal lines SL0, SL1, SLn−2 and SLn−1, respectively. The select transistors 212a, 212b, 212c and 212d select the functional signal lines in response to selection control signals S0, S1, Sn−2 and Sn−1, respectively.

The dummy selection unit 214 includes dummy line select transistors having the structure the same as that of the select transistors 212a, 212b, 212c and 212d and selects a dummy line DL1 in response to the selection control signal Sn−1 that selects the functional signal line SLn−1. In the same manner, the dummy selection unit 216 includes dummy line select transistors having the structure the same as that of the select transistors 212a, 212b, 212c and 212d and selects a dummy line DL2 in response to the selection control signal S0 that selects the functional signal line SL0.

In some embodiments of the semiconductor memory device, a cell layout including four banks, upper and lower cell array regions and eight cell blocks has been described for the purpose of convenience of explanation, it should be noted that the pass transistors for the dummy bit line can be disposed in the space between the pass transistors of the functional bit lines without increasing the chip size within the scope of the example embodiments. In addition, although it has been described that the selection control signal applied to the dummy selection unit is the signal to select the functional bit line located farthest, the example embodiments are not limited thereto. It may be sufficient if the selection control signal can select other functional bit lines that do not exert bad influence upon the functional bit line adjacent to the dummy bit line.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor memory device comprising:
a plurality of functional bit lines including an outermost bit line;
at least one dummy bit line adjacent the outermost bit line of the functional bit lines;
a dummy bit line selection unit that activates the at least one dummy bit line in response to a selection control signal of one of the functional bit lines that is not adjacent the at least one dummy bit line;
a cell block including a word line strapping region at a center area thereof, the cell block being divided into right and left regions about the word line strapping region, wherein the plurality of functional bit lines comprise first functional bit lines aligned at a predetermined space in the right region, a number of the first functional bit lines being even, and second functional bit lines aligned at a predetermined space in the left region, a number of the second functional bit lines being even;
an odd functional hit line selection unit disposed above the cell block and configured to select odd functional bit lines aligned in the right and left regions in response to a first corresponding selection control signal; and
an even functional bit line selection unit disposed under the cell block and configured to select even functional bit lines aligned in the right and left regions in response to a second corresponding selection control signal.

2. The semiconductor memory device of claim 1, wherein the at least one dummy bit line comprises:
a first dummy bit line disposed on the right region between a leftmost functional bit line of the first functional bit lines and the word line strapping region; and
a second dummy bit line disposed on the left region between a rightmost functional hit line of the second functional bit lines and the word line strapping region.

3. The semiconductor memory device of claim 2, wherein the dummy bit line selection unit comprises:
an odd dummy bit line selection unit disposed above the cell block and configured to select the first dummy bit line in response to a first selection control signal of a rightmost odd functional bit line of the right region; and
an even dummy bit line selection unit disposed under the cell block and configured to select the second dummy bit line in response to a second selection control signal of a leftmost even functional bit line of the left region.

4. A semiconductor memory device comprising:
a plurality of functional bit lines including an outermost bit line;
at least one dummy bit line adjacent the outermost bit line of the functional nit lines;
a dummy bit line selection unit that activates the at least one dummy bit line in response to a selection control signal of one of the functional bit lines that is not adjacent the at least one dummy bit line;
a cell block, wherein the plurality of functional bit lines are aligned on the cell block at a predetermined spacing, and the at least one dummy bit line comprises a first dummy bit line disposed between a left edge of the cell block and a leftmost functional bit line of the functional bit lines and a second dummy bit line disposed between a right edge of the cell block and a rightmost functional bit line of the functional bit lines;
a plurality of odd functional bit line selection units disposed above the cell block and configured to select odd functional bit lines in response to a first corresponding selection control signal;
a plurality of even functional bit line selection units disposed under the cell block and configured to select even functional bit lines in response to a second corresponding selection control signal;
a first dummy bit line selection unit adjacent to the odd functional bit line selection units, which are disposed above the cell block, and configured to select the first dummy bit line by simultaneously interacting with the odd functional bit line selection unit disposed farthest from the first dummy bit line selection unit among the odd functional bit line selection units; and
a second dummy bit line selection unit adjacent to the even functional bit line selection units, which are disposed under the cell block, and configured to select the second dummy bit line by simultaneously interacting with the even functional bit line selection unit disposed farthest from the second dummy bit line selection unit among the even functional bit line selection units.

5. The semiconductor memory device of claim 4, wherein the first dummy bit line selection unit is disposed to a left of a leftmost odd functional bit line selection unit of the odd functional bit line selection units and configured to select the first dummy bit line by simultaneously interacting with a rightmost odd functional bit line selection unit of the odd functional bit line selection units, and the second dummy bit line selection unit is disposed to a right of a rightmost even functional bit line selection unit of the even functional bit line selection units and configured to select the second dummy bit line by simultaneously interacting with a leftmost even functional bit line selection unit of the even functional bit line selection units.

6. A semiconductor memory device comprising:
a cell array region;
a plurality of functional signal lines aligned on the cell array region at a predetermined spacing;
at least one dummy line disposed between an edge of the cell array region and an outermost functional signal line of the functional signal lines;
a functional bit line selection unit disposed in an adjacent region of the cell array region and including a plurality of select transistors and configured to select the functional signal lines in response to a plurality of corresponding selection control signals, respectively;
a dummy bit line selection unit disposed adjacent to the functional bit line selection unit and including a dummy line select transistor configured to select the at least one dummy line in response to one selection control signal of the plurality of selection control signals, which is configured to select a functional signal line disposed farthest from the at least one dummy line;
a cell block including a word line strapping region at a center area thereof, the cell block being divided into right and left regions about the word line strapping region, wherein the plurality of functional signal lines comprise first functional signal lines aligned at a predetermined space in the right region, a number of the first functional signal lines being even, and second functional signal lines aligned at a predetermined space in the left region, a number of the second functional signal lines being even;
an odd functional signal line selection unit disposed above the cell block and configured to select odd functional signal lines aligned in the right and left regions in response to a first corresponding selection control signal; and
an even functional signal line selection unit disposed under the cell block and configured to select even functional signal lines aligned in the right and left regions in response to a second corresponding selection control signal.

7. The semiconductor memory device of claim 6, wherein the at least one dummy signal line comprises:
a first dummy signal line disposed on the right region between a leftmost functional signal line of the first functional signal lines and the word line strapping region; and
a second dummy signal line disposed on the left region between a rightmost functional signal line of the second functional signal lines and the word line strapping region.

8. The semiconductor memory device of claim 7, wherein the dummy signal line selection unit comprises:
an odd dummy signal line selection unit disposed above the cell block and configured to select the first dummy signal line in response to a first selection control signal of a rightmost odd functional signal line of the right region; and
an even dummy signal line selection unit disposed under the cell block and configured to select the second dummy signal line in response to a second selection control signal of a leftmost even functional signal line of the left region.

9. A semiconductor memory device comprising:
a cell array region;
a plurality of functional signal lines aligned on the cell array region at a predetermined spacing;
at least one dummy line disposed between an edge of the cell array region and an outermost functional signal line of the functional signal lines;
a functional bit line selection unit disposed in an adjacent region of the cell array region and including a plurality of select transistors and configured to select the functional signal lines in response to a plurality of corresponding selection control signals, respectively;
a dummy bit line selection unit disposed adjacent the functional bit line selection unit and including a dummy line select transistor configured to select the at least one dummy line in response to one selection control signal of the plurality of selection control signals, which is configured to select a functional signal line disposed farthest from the at least one dummy line;
a cell block including a word line strapping region at a center area thereof, the cell block being divided into right and left regions about the word line strapping region, wherein the plurality of functional signal lines comprise first functional signal lines aligned at a predetermined space in the right region, a number of the first functional signal lines being even, and second functional signal lines aligned at a predetermined space in the left region, a number of the second functional signal lines being even;
a plurality of odd functional signal line selection units disposed above the cell block and configured to select odd functional signal lines in response to a first corresponding selection control signal;
a plurality of even functional signal line selection units disposed under the cell block and configured to select even functional signal lines in response to a second corresponding selection control signal;
a first dummy signal line selection unit adjacent to the odd functional signal line selection units, which are disposed above the cell block, and configured to select the first dummy signal line by simultaneously interacting with the odd functional signal line selection unit disposed farthest from the first dummy signal line selection unit among the odd functional signal line selection units; and
a second dummy signal line selection unit adjacent to the even functional signal line selection units, which are disposed under the cell block, and configured to select the second dummy signal line by simultaneously interacting with the even functional signal line selection unit disposed farthest from the second dummy signal line selection unit among the even functional signal line selection units.

* * * * *